(12) United States Patent
Wu et al.

(10) Patent No.: US 7,669,153 B2
(45) Date of Patent: Feb. 23, 2010

(54) METHOD FOR CORRECTING PHOTOMASK PATTERN

(75) Inventors: Te-Hung Wu, Tainan County (TW); Chuen-Huei Yang, Taipei (TW); Sheng-Yuan Huang, Yunlin County (TW); Chia-Wei Huang, Kaohsiung (TW); Pei-Ru Tsai, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 403 days.

(21) Appl. No.: 11/742,372

(22) Filed: Apr. 30, 2007

(65) Prior Publication Data
US 2008/0270969 A1    Oct. 30, 2008

(51) Int. Cl.
*G06F 17/50*    (2006.01)
(52) U.S. Cl. ............... 716/5; 716/4; 716/11; 716/19
(58) Field of Classification Search ............... 716/4, 716/5, 11, 19
See application file for complete search history.

(56) References Cited

U.S. PATENT DOCUMENTS

| | | | |
|---|---|---|---|
| 6,961,920 B2 | 11/2005 | Zach | |
| 2002/0098427 A1* | 7/2002 | Chen et al. | 430/30 |
| 2006/0161452 A1 | 7/2006 | Hess | |

* cited by examiner

*Primary Examiner*—Thuan Do
(74) *Attorney, Agent, or Firm*—Winston Hsu

(57) ABSTRACT

A method for correcting a photomask pattern is provided. The correcting method performs a verification of a focus-exposure matrix (FEM) and an overlay variation on a layout area having contact holes or vias in a layout pattern so as to generate a hint information. The layout pattern of the photomask is corrected according to the hint information to prevent the contact holes or vias from being exposed in arrangement to corresponding metal layer, poly layer, or diffusion layer.

13 Claims, 6 Drawing Sheets

METHOD FOR CORRECTING PHOTOMASK PATTERN

BACKGROUND OF THE INVENTION

1. Field of the Invention

The present invention relates to a method for correcting a photomask pattern. More particularly, the present invention relates to a method for correcting the photomask pattern by the use of a focus-exposure matrix (FEM) and an overlay variation at the same time.

2. Description of Related Art

Nowadays, integrated circuits (IC) have been greatly developed, and it is a trend and also an important topic in various fields to miniaturize and integrate devices. In an entire semiconductor process, lithography is one of the important steps, so the accuracy in transferring a photomask pattern to a wafer is quite important. If the transfer of the pattern is not accurate, the tolerance of the critical dimension (CD) on the chip is affected, and the exposure resolution is lowered.

Usually, an optical proximity correction (OPC) and the FEM are used to correct the photomask pattern. However, as the device size is continually reduced, the process of the pattern transfer may generate position offset due to the increasing challenge of accuracy in pattern transfer, thus resulting in the overlay variation between layers. The position offset may directly affect the coverage ratio of the line pattern to the corresponding hole pattern between interconnecting layers and cause exposure of the hole patterns. Here, due to the insufficient coverage ratio between the contact holes or the vias and the metal layer, the diffusion layer, or the poly layer in corresponding positions, the contact holes or the vias are exposed.

The conventional method for correcting the photomask employs the FEM to correct the layout pattern. The FEM mainly verifies the effects of the focus depth and the exposure energy during exposure on the transferred layout pattern, excluding the position offset of the contact holes or the vias generated in the process of the pattern transfer. Therefore, it is impossible for the conventional verification method to precisely verify the coverage ratio between the contact holes or the vias in the chip and the metal layer, the diffusion layer, or the poly layer in corresponding positions, thus resulting in the exposure of the contact holes or the vias.

SUMMARY OF THE INVENTION

Accordingly, the present invention is directed to a method for correcting the photomask pattern, which considers the effect of the FEM on the pattern profile and the overlay variation (the position offset between layers) generated in the process, so as to prevent the contact holes or the vias from being exposed.

The present invention is also directed to a method for correcting the photomask pattern, in which the offset of the contact holes or the vias on different directions and the coverage ratio between the contact holes or the vias and the corresponding layer are verified, so as to generate a hint information and correct the layout pattern on the photomask accordingly.

The present invention is further directed to provide a method for correcting the photomask pattern, which considers the position offset of the contact holes or the vias generated in the process, and uses the verification of the FEM to reduce the occurrence rate of the exposure of the contact holes or the vias.

The present invention provides a method for correcting the photomask pattern, which includes the following steps. Firstly, a layout file corresponding to a layout pattern is received. Next, the verification of the FEM and the overlay variation is performed on the layout area having contact holes or vias in the layout pattern, so as to generate a hint information and correct the layout pattern according to the hint information.

In the method for correcting the photomask pattern according to an embodiment of the present invention, the step of performing a verification of the FEM and the overlay variation further includes performing the verification of the FEM and the overlay variation on a metal layer, a diffusion layer, and a poly layer corresponding to the layout area in the layout pattern, so as to generate the hint information.

In the method for correcting the photomask pattern according to an embodiment of the present invention, the verification of the overlay variation includes setting a moving distance and a moving direction of contact holes or vias of the layout pattern according to a process condition, and verifying the coverage ratio between the metal layer, the diffusion layer, or the poly layer in corresponding positions and the contact holes or the vias in the layout pattern.

In the method for correcting the photomask pattern according to an embodiment of the present invention, the verification of the overlay variation further includes verifying the coverage ratio between the metal layer, the diffusion layer, or the poly layer in corresponding positions and the contact holes or the vias in the layout pattern with the moving direction of a plurality of angles. For example, four opposite angles of the contact holes or the vias are used as the moving direction in which the offset possibly occurs.

In an embodiment of the present invention, in the method for correcting the photomask pattern, the hint information includes the coverage ratio between the contact holes or the vias in the layout pattern and the metal layer, the diffusion layer, or the poly layer in corresponding positions in different moving directions, and a correction advice.

The present invention further provides a method for correcting the photomask pattern, which includes the following steps. Firstly, a layout file corresponding to a layout pattern is received. Next, the coverage ratio between the contact holes or the vias in the layout pattern and the metal layer, the diffusion layer, or the poly layer in corresponding positions is verified, so as to generate a hint information. Then, the layout pattern is corrected according to the hint information.

From another point of view, the present invention provides a method for correcting the photomask pattern, which includes the following steps. Firstly, a layout file corresponding to a layout pattern is received. Then, it is inspected whether the layout pattern includes a layout area having contact holes or vias. If the layout pattern includes the layout area with contact holes or vias, a verification of a FEM and an overlay variation is performed on the layout area, and the layout pattern is corrected with an OPC. Next, the layout pattern is corrected according to a lithography rule, and the layout pattern is corrected according to a focus exposure modeling. Then, the coverage ratio between the contact holes or the vias in the layout area and the metal layer, the diffusion layer, or the poly layer in corresponding positions is verified, so as to generate a hint information. Then, the layout pattern is corrected according to the hint information.

In the present invention, both the effect of the FEM on the pattern profile in the layout pattern and the position offset possibly generated in the actual process are considered, so as to minimize the overlay variation between layers, and to prevent the contact holes or the vias from being exposed.

In order to the make aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Lithography, exposure, and process may incur an offset of device on a chip or may cause an overlay variation between layers, so the present invention considers the effects of the OPC, the FEM, and the overlay variation on the layout pattern during the photomask pattern correction. Before the photomask pattern is fabricated, the layout pattern on the photomask is suitably corrected directing to the variation possibly generated in the lithography, exposure, and process, so as to effectively increase the yield of the chip.

Figure 1:
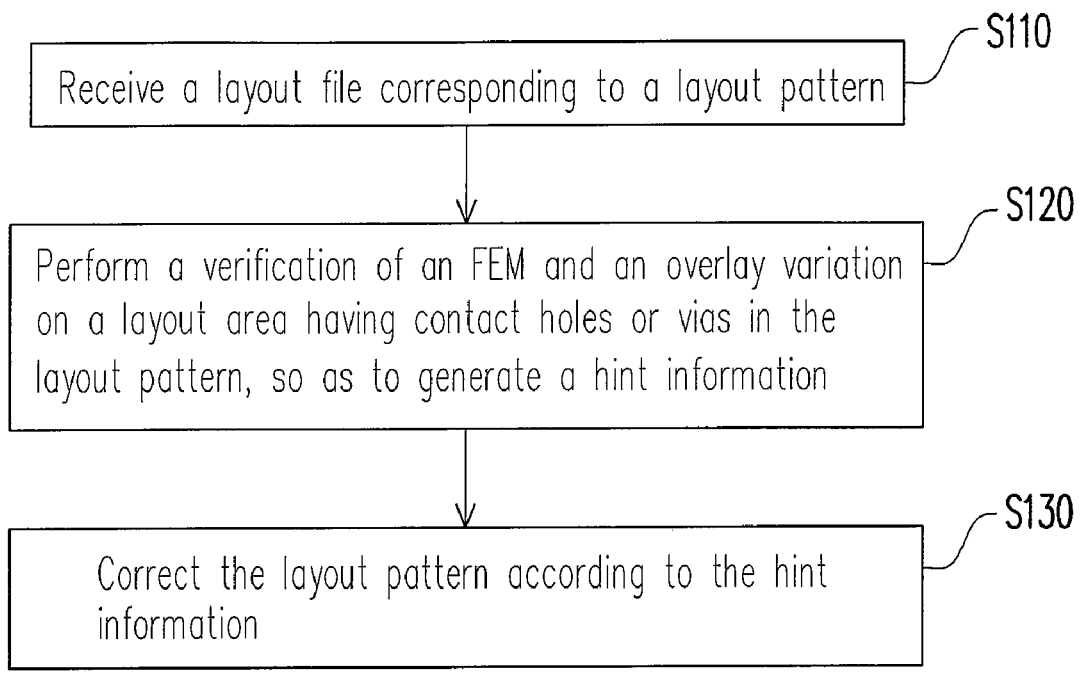
FIG. 1 is a flow chart of a method for correcting a photomask pattern according to an embodiment of the present invention.

Next, the implementation of the present invention is illustrated with the flow charts. FIG. 1 is a flow chart of a method for correcting a photomask pattern according to an embodiment of the present invention. Firstly, in step S110, a layout file corresponding to a layout pattern is received. Next, an initialization action, for example, a file format conversion or a Boolean function operation is performed on the layout file, so as to convert the layout file to the file format suitable for the OPC. Then, in step S120, the verification of the FEM and the overlay variation on the layout area having the contact holes or the vias in the layout pattern is performed, so as to generate a hint information.

The FEM mainly verifies the effects of the focus depth and the exposure energy during exposure on the transferred layout pattern, particularly the effect on the profile of the layout pattern. As the exposure is not desired, the profile of the layout pattern may generate certain variation. The overlay variation mainly refers to the variation of the relative position between layers generates variation or the asymmetry, for example, the relative position between the contact window and the metal layer. As in the course of the pattern transfer or process, different photomask layers transfer the layout pattern at different time and in different processing procedures, the relative position between layers may offset. Moreover, currently, the device size is greatly reduced, a slight position offset may affect the coverage ratio between the contact holes or the vias and the corresponding layer (such as the metal layer or the diffusion layer). For example, the contact holes or the vias must be totally located in the layout area of the metal layer. If the positions of the contact holes or the vias offset, the contact holes or the vias may protrude from the layout area of the metal layer, thus being exposed.

In the conventional art, the OPC for the FEM does not consider the position offset of the contact holes or the vias generated in the process or exposure. In this embodiment, in step S120, double verifications of the FEM and the overlay variation are performed, so as to verify whether the coverage ratio between the contact holes or the vias and the metal layer, the diffusion layer, or the poly layer in the relative position conforms to the design. In this embodiment, the verification of the overlay variation mainly sets a moving distance and a moving direction of the contact holes or the vias in the layout pattern according to the processing condition, and verifies the coverage ratio between the metal layer, the diffusion layer, or the poly layer in corresponding positions and the contact holes or the vias under different offset conditions.

The verification of the moving direction includes a plurality of angles, for example, four opposite angles of the contact holes or the vias. Then, according to different processing conditions, the position offsets and the offset distances in different directions are simulated. Next, the effect of the FEM on the layout pattern profile is used to verify whether the coverage ratio between the metal layer, the diffusion layer, or the poly layer in corresponding positions and the contact holes and the vias conforms to the standard, for example, total overlay. Then, in step S120, a hint information is output according to the verification result. The hint information includes the coverage ratio between the contact holes or the vias in the layout pattern and the metal layer, the diffusion layer, or the poly layer in corresponding positions under all offset conditions, and a correction advice. In step S130, the layout pattern is corrected according to the hint information. As for the correction condition, the user sets a default value. If the coverage ratio is smaller than the default value, it is necessary to further correct the relative layout pattern. In another embodiment of the present invention, the step S120 and the step S130 can be used to repeat the verification of the coverage ratio between the contact holes or the vias in the layout pattern and the position offset until conforming to the design requirement.

Figure 2:
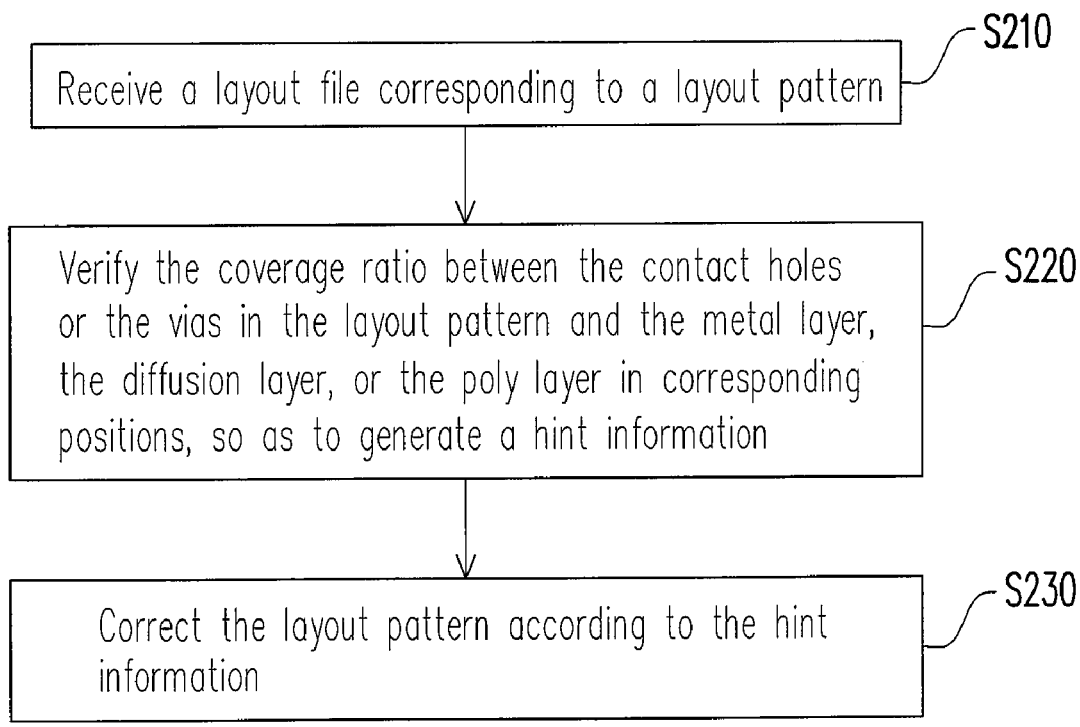
FIG. 2 shows the method for correcting the photomask pattern according to another embodiment of the present invention.

Next, FIG. 2 shows the method for correcting the photomask pattern according to another embodiment of the present invention, which is mainly applied to a flow of correcting the overlay variation. Firstly, in step S210, a layout file corresponding to a layout pattern is received. Next, in step S220, the simulation condition of the moving distance and the moving direction of the contact holes or the vias are set according to different processing conditions, so as to verify the coverage ratio between the contact holes or the vias in the layout pattern and the metal layer, the diffusion layer, or the poly layer in corresponding positions to generate a hint information accordingly. In step S230, the layout pattern is corrected according to the received hint information.

In step S220, the moving direction is set with a plurality of angles, for example four opposite angles of the contact holes or the vias. Then, the coverage ratio between the metal layer, the diffusion layer, or the poly layer in corresponding positions and the contact holes or the vias in layout pattern is verified, so as to obtain a maximum error angle at which the exposure possibly occurs, and to provide the hint information.

Figure 3:
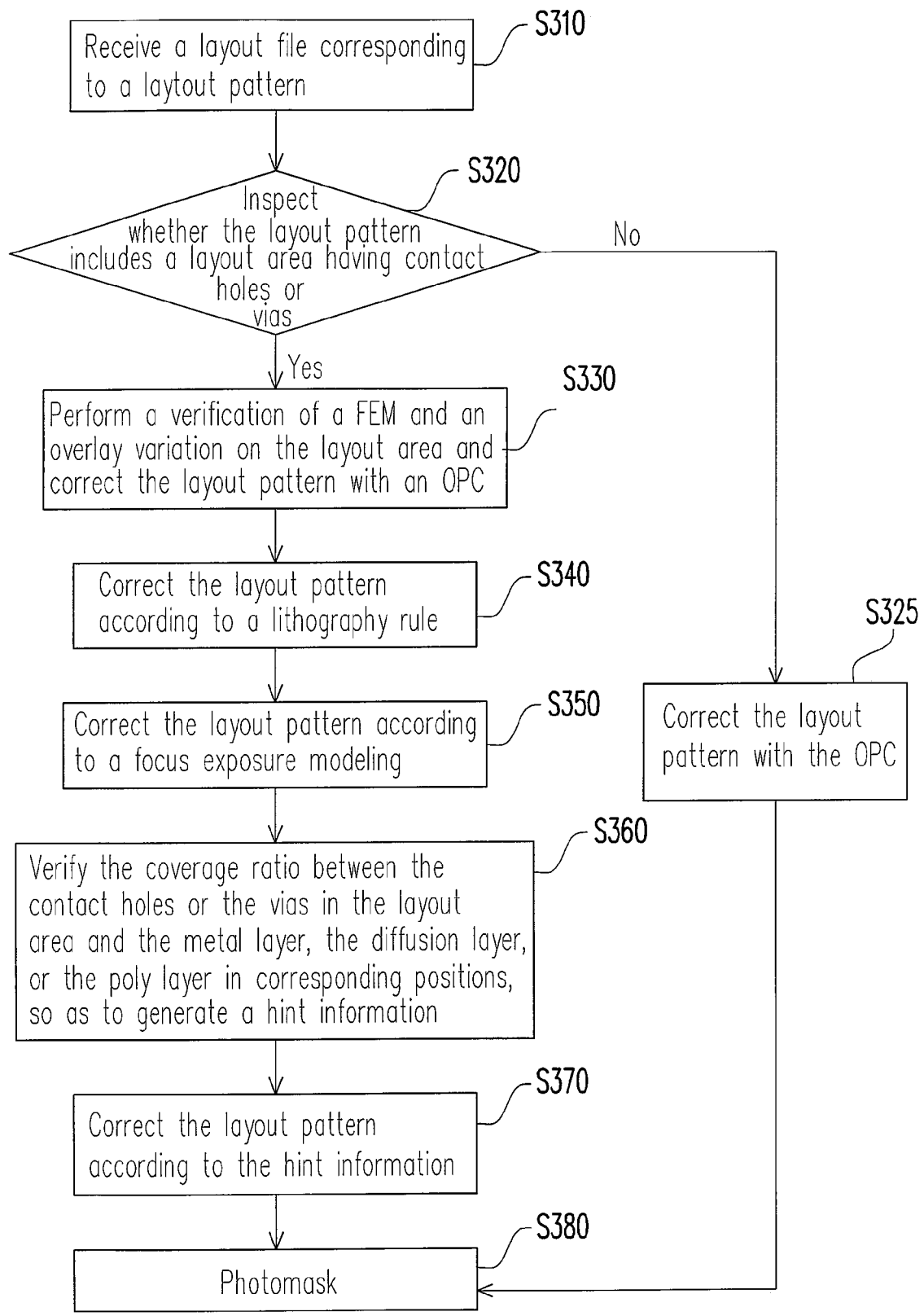
FIG. 3 is a flow chart of the method for correcting the photomask pattern according to another embodiment of the present invention.

In another embodiment of the present invention, in the operating steps of FIGS. 1 and 2, the OPC can be used for the layout, for example in the step S120, the OPC is performed on the layout pattern, such that the function of the original OPC is maintained, and the accuracy of correcting the photomask is increased. FIG. 3 is a flow chart of the method for correcting the photomask pattern according to another embodiment of the present invention. In step S310, a layout file corresponding to the layout pattern is received. Next, a step S320 inspects whether the layout pattern includes a layout area having the contact holes or the vias. If no, the flow enters step S325, the OPC is used to correct the layout pattern. If yes, the flow enters step S330, the verification of the FEM and the overlay variation is performed on the layout area having the contact holes and the vias, and corrects the layout pattern with the OPC.

Next, in step S340, the layout confirmation of the layout pattern is performed according to the lithography rule and the layout pattern is corrected. In step S350, the layout pattern is corrected according to the focus exposure modeling, so as to achieve the optimal lithography effect. Then, in step S360, the coverage ratio between the contact holes or the vias in the verified layout area and the metal layer, the diffusion layer, or the poly layer in corresponding positions, so as to generate a hint information. The hint information includes the coverage ratio verification in different directions and the correction advice. In step S370, the layout pattern is corrected according to the hint information. Finally, in step S380, the layout pattern on the photomask is generated according to the corrected result.

Figure 4:
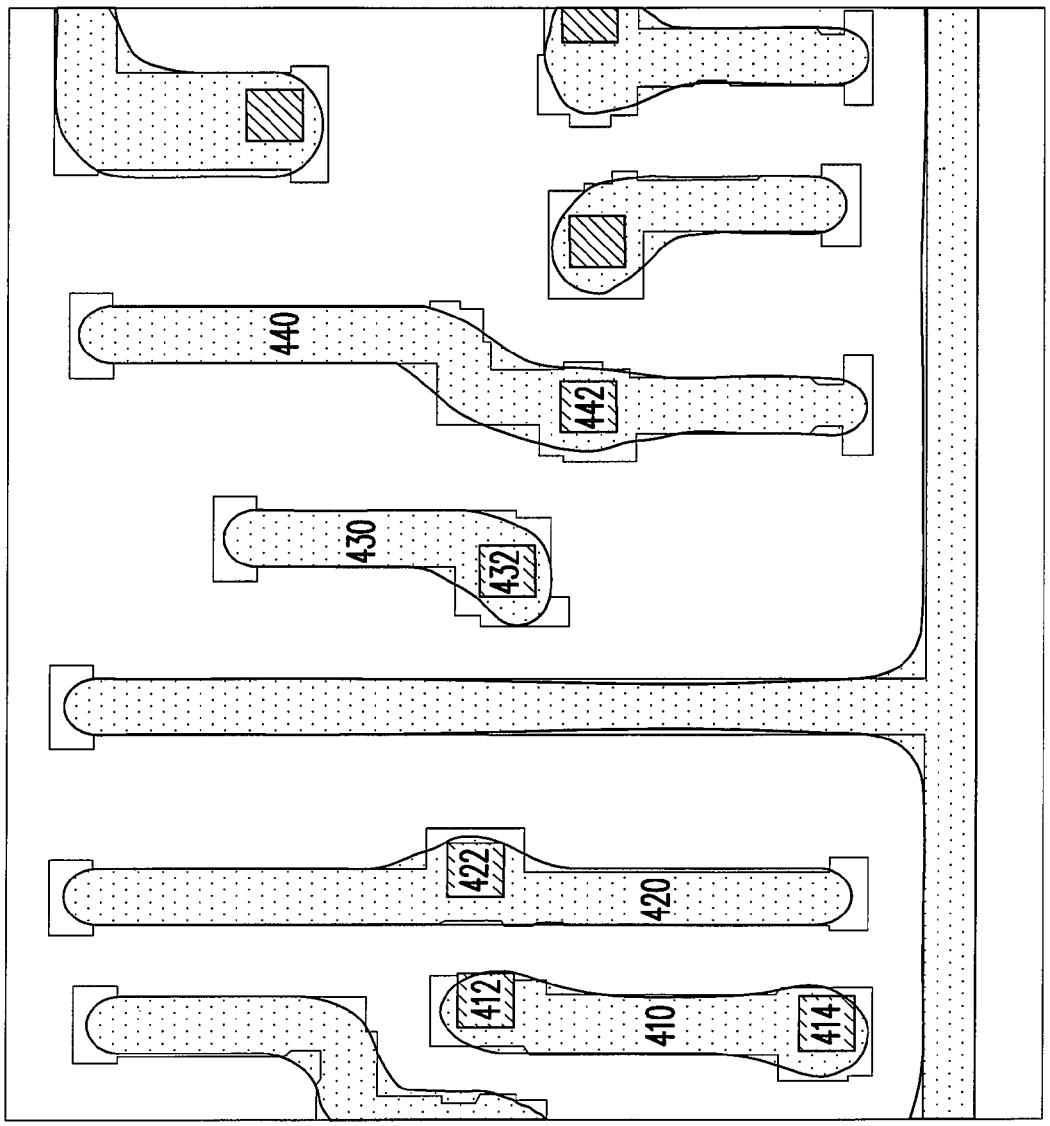
FIG. 4 shows a layout pattern corrected by the use of an OPC according to an embodiment of the present invention.
Figure 5:
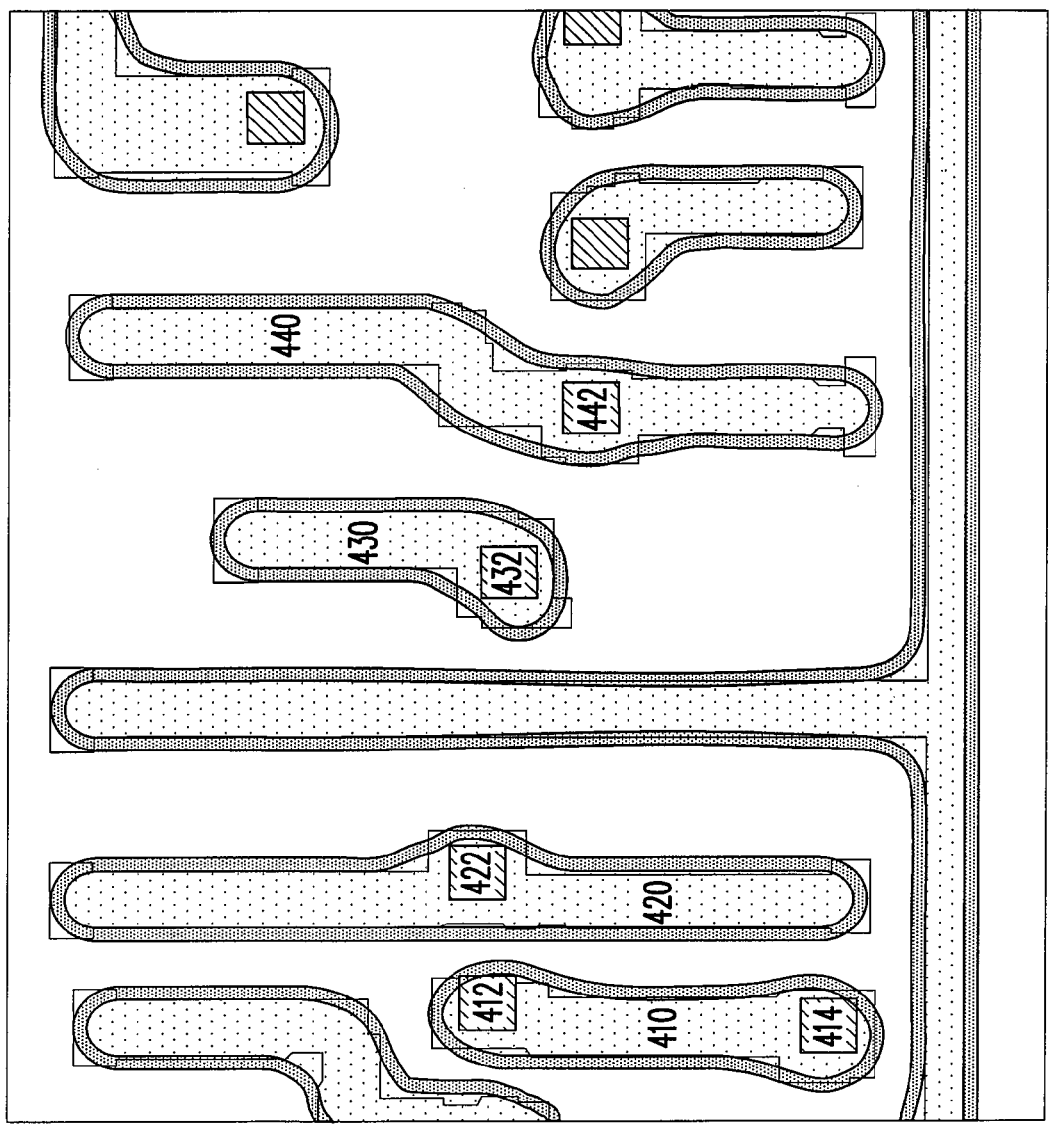
FIG. 5 shows a layout pattern corrected by the use of an FEM according to an embodiment of the present invention.

Next, the simulation results of the layout pattern obtained by using different verification methods are illustrated in accompanying with the drawings. FIG. 4 shows a layout pattern corrected by the use of an OPC. The contact holes 412, 414, 422, 432, 442 must be totally located in the layout area of the metal layers 410, 420, 430, 440. However, the contact holes 412 and 414 are exposed, that is, it is impossible for the metal layer 410 to totally cover the layout area of the contact holes 412 and 414. A layout pattern corrected by the use of the FEM is shown in FIG. 5. Due to the influence of the focus depth, the exposure energy, and the focus center during exposure on the actual layout pattern, in FIG. 5, the profile variation of the metal layers 410-440 may be aggravated. As shown in FIG. 5, it is verified that the contact window 422 in the metal layer 420 is exposed. However, it is not verified that the layout area having the contact holes 432 and 442 is exposed.

Figure 6B:
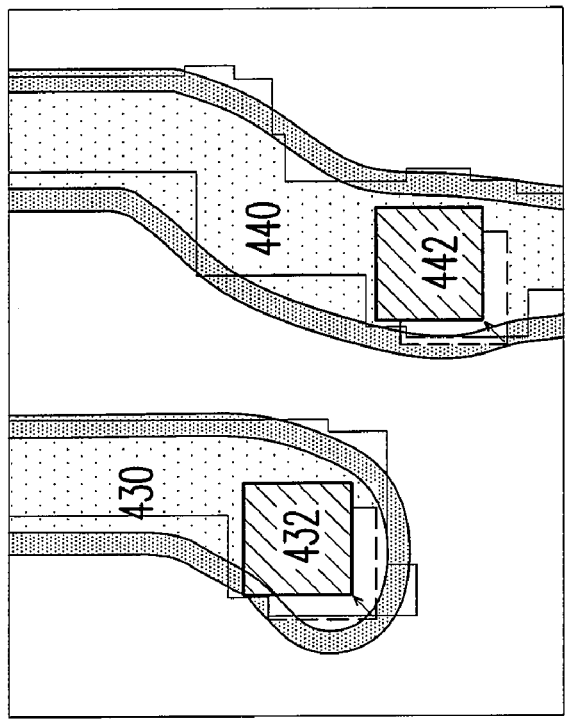
FIG. 6B is a schematic view of the simulation of the top right offset of the contact holes 432 and 442.
Figure 6A:
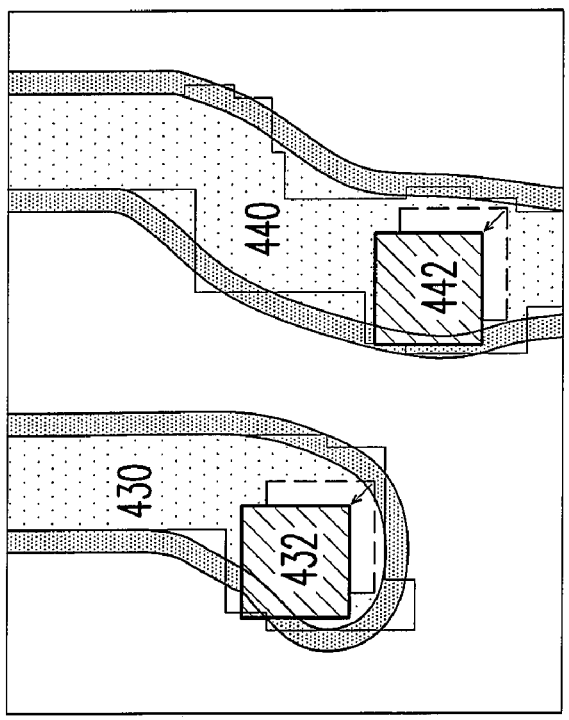
FIG. 6A is a schematic view of the simulation of the top left offset of the contact holes 432 and 442.
Figure 6C:
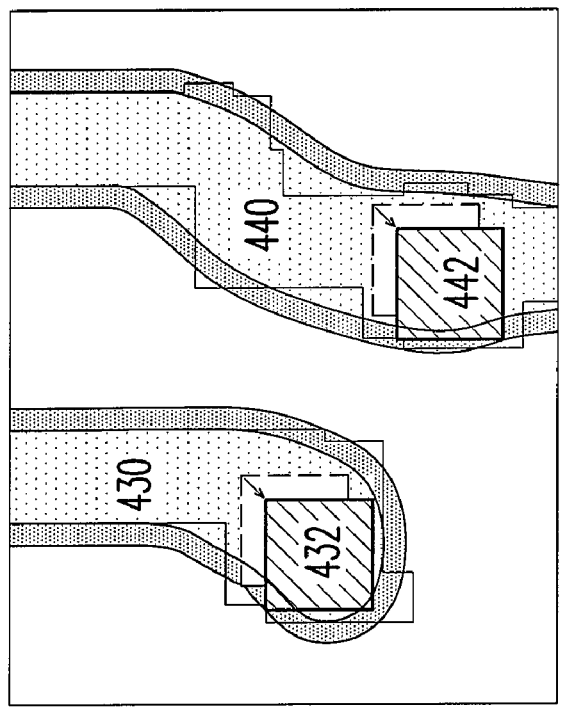
FIG. 6C is a schematic view of the simulation of the bottom left offset of the contact holes 432 and 442.
Figure 6D:
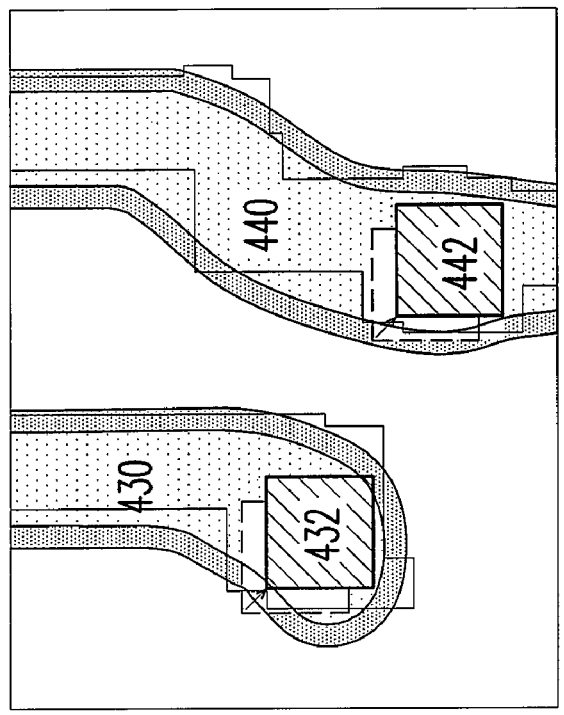
FIG. 6D is a schematic view of the simulation of the bottom right offset of the contact holes 432 and 442.

Next, as shown in FIGS. 6A-6D, the position offset during the processing is considered. FIGS. 6A to 6D are layout patterns after the overlay variation is considered. In this embodiment, four possible offset moving directions (four opposite angles of the contact) are set. Then, the layout area having the contact holes 432 and 442 and the metal layers 430 and 440 are taken as an example to illustrate the verification method of the overly variation of the contact holes 432 and 442 and the metal layers 430 and 440. FIG. 6A is a schematic view of the simulation of the top left offset of the contact holes 432 and 442. FIG. 6B is a schematic view of the simulation of the top right offset of the contact holes 432 and 442. FIG. 6C is a schematic view of the simulation of the lower left offset of the contact holes 432 and 442. FIG. 6D is a schematic view of the simulation of the lower right offset of the contact holes 432 and 442. As shown in FIG. 6A, it is verified the top left corner of the contact holes 432 and 442 may be exposed. Therefore, when the layout pattern on the photomask is corrected, the layout positions of the contact holes 432 and 442 may be individually corrected, so as to prevent the contact window from being exposed. If the effects of the OPC, the FEM, and the overlay variation on the transferred layout pattern are taken into consideration simultaneously, the layout pattern on the photomask (the photomask pattern) may be corrected more precisely, so as to prevent the contact holes or the vias from being exposed.

It can be known from FIGS. 4-6D that when the photomask pattern (the layout pattern on the photomask) is corrected, the position offset that possibly generated in the process can be further verified, so as to precorrect the layout pattern to prevent the exposure, particularly the exposure of the contact holes or the vias. Further, the present invention is not limited to the verification of the contact holes and the vias, but is also suitable for the verification of the overlay variation between different layers. The position offset direction is also not limited to four opposite angle directions, and the position offsets in the horizontal or vertical directions may be verified at the same time. The implementation can be easily deduced by those of ordinary skill in the art, and the details will not be described herein again.

To sum up, in the present invention, the overlay variation resulting from the process, OPC and the FEM are taken into consideration simultaneously, so it is possible to precisely verify the contact holes or the vias which possibly being exposed, so as to correct the layout pattern and increase the yield of the chip.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for correcting a photomask pattern, comprising:
receiving a layout file, corresponding to a layout pattern;
performing a verification of a focus-exposure matrix (FEM) and an overlay variation on a layout area having contact holes or vias in the layout pattern, so as to generate a hint information, wherein the verification of the overlay variation sets a moving distance and a moving direction of the contact holes or the vias of the layout pattern according to a process condition, and verifies the coverage ratio between the metal layer, the diffusion layer, or the poly layer in corresponding positions and the contact holes or the vias in the layout pattern with the moving direction of a plurality of angles;
correcting the layout pattern according to the hint information; and
outputting the corrected layout pattern to a photomask.

2. The method for correcting the photomask pattern as claimed in claim 1, wherein the step of performing a verification of the FEM and the overlay variation further comprises performing the verification of the FEM and the overlay variation on a metal layer, a diffusion layer, and a poly layer corresponding to the layout area in the layout pattern, so as to generate the hint information.

3. The method for correcting the photomask pattern as claimed in claim 1, wherein the step of performing the verification of the FEM and the overlay variation further comprises correcting the layout pattern with an optical proximity correction (OPC).

4. The method for correcting the photomask pattern as claimed in claim 1, wherein the step of performing the verification of the FEM and the overlay variation further comprises inspecting whether the layout pattern comprises contact holes or vias, and if the layout pattern does not comprise the contact holes or the vias, the layout pattern is corrected with an OPC.

5. The method for correcting the photomask pattern as claimed in claim 1, wherein the verification of the FEM comprises effects of focus depth and exposure energy on the layout pattern.

6. The method for correcting the photomask pattern as claimed in claim 1, wherein the angles comprise four opposite angles of the contact holes or the vias in the layout pattern, so as to verify a maximum error angle.

7. The method for correcting the photomask pattern as claimed in claim 1, wherein the hint information comprises the coverage ratio between the contact holes or the vias in the layout pattern and the metal layer, the diffusion layer, or the poly layer in corresponding positions, and a correction advice.

8. The method for correcting the photomask pattern as claimed in claim 1, further comprising:
correcting the layout pattern according to a lithography rule.

9. The method for correcting the photomask pattern as claimed in claim 1, further comprising:
correcting the layout pattern according to a focus exposure modeling.

10. A method for correcting the photomask pattern, comprising:
receiving a layout file corresponding to a layout pattern;
verifying a coverage ratio between contact holes or vias in the layout pattern and a metal layer, a diffusion layer, or a poly layer in corresponding positions so as to generate a hint information, wherein the verification step comprises setting a moving distance and a moving direction of the contact holes or the vias in the layout pattern according to a processing condition, and verifying the coverage ratio between the metal layer, the diffusion layer, or the poly layer in corresponding positions and the contact holes or the vias in the layout pattern with the moving direction of a plurality of angles;
correcting the layout pattern according to the hint information; and
outputting the corrected layout pattern to a photomask.

11. The method for correcting the photomask pattern as claimed in claim 10, wherein the angles comprise four opposite angles of the contact holes or the vias in the layout pattern.

12. A method for correcting the photomask pattern, comprising:
receiving a layout file corresponding to a layout pattern;
inspecting whether the layout pattern comprises a layout area having contact holes or vias;
if the layout pattern comprises the layout area, performing a verification of an FEM and an overlay variation on the layout area and correcting the layout pattern with an OPC;
correcting the layout pattern according to a lithography rule;
correcting the layout pattern according to a focus exposure modeling;
verifying the coverage ratio between the contact holes or the vias in the layout area and the metal layer, the diffusion layer, or the poly layer in corresponding positions with the moving direction of a plurality of angles, so as to generate a hint information;
correcting the layout pattern according to the hint information and
outputting the corrected layout pattern to a photomask.

13. The method for correcting the photomask pattern as claimed in claim 12, further comprising:
if the layout pattern does not comprise the contact windows or the vias, correcting the layout pattern according to the OPC.

* * * * *